United States Patent
Matsumoto et al.

(10) Patent No.: US 6,329,216 B1
(45) Date of Patent: Dec. 11, 2001

(54) METHOD OF MANUFACTURING AN ALGAINP LIGHT EMITTING DEVICE USING AUTO-DOPING

(75) Inventors: Yukio Matsumoto; Shunji Nakata; Yukio Shakuda, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/597,568

(22) Filed: Jun. 20, 2000

Related U.S. Application Data

(62) Division of application No. 09/079,260, filed on May 15, 1998, now Pat. No. 6,107,647.

(30) Foreign Application Priority Data

May 15, 1997 (JP) .................................... 9-125164
May 15, 1997 (JP) .................................... 9-125165

(51) Int. Cl.[7] .................................................. H01L 21/00
(52) U.S. Cl. ............................. 438/47; 438/46; 257/94
(58) Field of Search ............................. 257/94, 96, 97, 257/102, 103; 438/46, 47, 930

(56) References Cited

U.S. PATENT DOCUMENTS 5,557,627 * 9/1996 Schneider, Jr. et al. ............... 372/46
5,600,158 * 2/1997 Noto et al. ............................ 257/94
6,181,723 * 1/2001 Okubo et al. ......................... 372/45

OTHER PUBLICATIONS

Ito et al., Carbon–Doped Base AlGaAs/GaAs HBTs Grown by MOCVD Using TMAs, *Electronics Letters*, 25(1989) 1302.*

Mashita et al., Comparative study on carbon incorporation in MOCVD AlGaAs layers between arsine and tertiarybutylarsine, *J. Crystal Growth*, 155(1995) 164–170.*

Mizutani et al., A Low–Threshold Polarization–Controlled Vertical–Cavity Surface–Emitting Laser Grown on GaAs (311)B Substrate, *IEEE Photonics Tech. Lett.*, 10(1998) 633–635.*

* cited by examiner

Primary Examiner—Richard Elms
Assistant Examiner—Christian D. Wilson
(74) Attorney, Agent, or Firm—Arent Fox Kintner Plotkin & Kahn PLLC

(57) ABSTRACT

A semiconductor light emitting device has a light emitting layer forming portion formed on the substrate and having an n-type layer and a p-type layer to provide a light emitting layer. A window layer is formed on a surface side of the light emitting layer forming portion. The window layer is formed of $AlyGa_{1-y}As$ ($0.6 \leq y \leq 0.8$) auto-doped in a carrier concentration of $5 \times 10^{18} - 3 \times 10^{19}$ $cm^{-3}$. The resulting semiconductor light emitting device is free of degradation in crystallinity due to p-type impurity doping, thereby provide a high light emitting efficiency and brightness without encountering device degradation or damage.

2 Claims, 2 Drawing Sheets

METHOD OF MANUFACTURING AN ALGAINP LIGHT EMITTING DEVICE USING AUTO-DOPING

This application is a divisional application of application Ser. No. 09/079,260, filed May 15, 1998 now U.S. Pat. No. 6,107,647.

BACKGROUND OF THE INVENTION

This invention relates to a semiconductor light emitting device which is improved in semiconductor crystalline quality to have an enhanced light emitting efficiency, for use as a light source requiring high brightness, such as for outdoor displays and vehicular tail lamps and direction indicators, or a light source requiring high brightness but low-power consumption, such as for back-lights of battery-driven portable units such as handy telephones and indicator lamps, besides for optical communications or optical information processing.

There is a conventional semiconductor light emitting device having a light emitting layer forming portion formed by using an AlGaInP-based compound semiconductor for emitting visible light, as disclosed, for example, in Japanese Laying-open Patent Publication No. H4-212479. This known semiconductor light emitting device is structured as shown in FIG. 4. In FIG. 4, the device includes an n-GaAs semiconductor substrate 21. On the semiconductor substrate 21 are epitaxially grown, in order, an n-type cladding layer 22 of an n-type AlGaInP-based compound semiconductor, an active layer 23 of a non-doped AlGaInP-based semiconductor material in a composition having a bandgap energy lower than that of the cladding layer, and a p-type cladding layer 24 of a p-type AlGaInP-based compound semiconductor, thereby forming a doublehetero structure providing a light emitting layer forming portion 29. Further, a p-type window layer (current diffusion layer) 25 is epitaxially grown of a GaAs-based semiconductor material on a surface of the light emitting layer forming portion 29. On the window layer 25 a p-side electrode 27 is formed through a p-type GaAs contact layer 26, while an n-side electrode 28 is formed on a backside of the semiconductor substrate 21. These electrodes 27, 28 are formed of an Au—Ge—Ni alloy or the like.

The light emitting device of this structure is arranged to confine carriers within the active layer 23 sandwiched between the respective cladding layers 22, 24, for emitting light. Accordingly, the cladding layers 22, 24 and the window layer 25 are doped with an impurity to an appropriate carrier concentration. The p-type layers 24, 25, 26 are doped with an impurity such as Zn, Mg or Be. Meanwhile, the window layer 25 has to be formed of a material having a higher bandgap energy than the bandgap energy of the emission-light wavelength, in order not to absorb the light emitted by the active layer. Thus, the AlGaAs-based compound semiconductor material is used for the window layer 25. Even where the AlGaAs-based compound semiconductor is employed, if it is low in Al mixed-crystal ratio, the bandgap energy is decreased to absorb a certain amount of the light emitted by the light emitting layer forming portion. Accordingly, the compound semiconductor in practical use has an Al mixed-crystal ratio increased to approximately 0.7–0.8.

In the conventional semiconductor light emitting device shown in FIG. 4, the GaAs substrate and the AlGaInP-based compound semiconductor are controlled in lattice-match by adjusting the mixed crystal ratio between (AlGa) and In. Also, the AlGaAs-based compound semiconductor, if doped with Zn or Mg, becomes mismatching in lattice to the AlGaInP-based compound semiconductor. In such a case, a process for further matching is necessarily performed, resulting in poor film crystallinity. On the other hand, it is not preferred for the cladding layer to increase the carrier concentration, in view of the effect of carrier confinement within the active layer and the suppression against diffusion of an impurity from the cladding layer into the active layer. In contrast to this, it is preferred that the window layer be given a carrier concentration as high as possible. However, if the window layer is doped to a high concentration with a p-type impurity (2-valence atom with respect to a III-V compound semiconductor) such as Zn, Mg or Be, the film crystallinity worsens as stated before. This might cause a phenomenon such as cracks or chip fracture in the semiconductor layer due to internal strains or distortions, as can be observed by a reliability test with applying currents at low temperatures. This raises a problem that the device is lowered in light emitting efficiency or tendency to be damaged.

Meanwhile, the emission light is transmitted toward the front of the semiconductor light emitting device, even where a window layer the device is formed of an AlGaInP with an increased Al mixed-crystal ratio on the surface thereof, similarly to the semiconductor light emitting device as shown in FIG. 4. However, there is absorption or blockage of the emission light by the front electrode as well as the GaAs contact layer for improving ohmic-contact characteristics between the electrode and the semiconductor layer. To cope with this, the top electrode and the contact layer is removed away with a required minimum area left, thus exposing the window layer at a top surface. This surface, in some cases, is covered by a package resin or the like. However, the resin and the semiconductor are poorly matched, giving rise to intrusion of moisture or water content through an interface therebetween. Since in such a case the semiconductor material having an increased Al mixed-crystal ratio appears in the interface, the Al content reacts with the intruded moisture, causing corrosion or oxidation. The corrosion or oxidation, if proceeds deep inside the semiconductor layers, possibly deteriorating the crystalline structure of the light emitting layer forming portion. Thus, there is a problem that the device might be degraded in light emitting efficiency as well as reliability.

SUMMARY OF THE INVENTION

It is therefore an object of the present invention to provide a semiconductor light emitting device which is free of degradation in crystallinity due to p-type impurity doping, thereby provide a high light emitting efficiency and brightness without encountering device degradation or damage.

It is another object of the present invention to provide a reliable semiconductor light emitting device which is arranged to prevent the semiconductor layers from being corroded at a surface by intrusion of moisture or water content which corrosion possibly advances deep into an inside of the semiconductor layers to cause deterioration in characteristics of the semiconductor light emitting device.

It is a further object of the present invention to provide a method of manufacturing a semiconductor light emitting device capable of prevent the crystallinity from worsening caused by p-type impurity doping.

The present inventors have eagerly studied in order to prevent internal stresses from occurring to thereby lower the light emitting efficiency and the reliability as encountered upon forming a window layer using the above-stated AlGaAs-based compound semiconductor. As a result, it was found that, when forming a p-type window layer, it is possible to utilize as a dopant a metal contained in a reacting gas in an MOCVD process, wherein the carrier concentration can be controlled by controlling the temperature during epitaxially growing semiconductor layers. It was further found that if the window layer is formed at a carrier concentration of $5\times10^{18}$–$3\times10^{19}$ cm$^{-3}$, the resulting semiconductor light emitting device is reduced in internal stresses thus providing high brightness and reliability.

A semiconductor light emitting device according to the present invention, comprises: a substrate; a light emitting layer forming portion formed on the substrate and having an n-type layer and a p-type layer to provide a light emitting layer; and a window layer formed on a surface side of the light emitting layer forming portion; wherein the light emitting layer forming portion is formed of AlGaInP-based compound semiconductor, and the window layer is formed of $Al_y Ga_{1-y} As$ ($0.6 \leq y \leq 0.8$) auto-doped in a carrier concentration of $5\times10^{18}$–$3\times10^{19}$ cm$^{-3}$.

Here, the AlAlInP-based compound semiconductor means a material expressed by a formula $(Al_x Ga_{1-x})_{0.51} In_{0.49} P$ wherein the value x is variable between 0 and 1. Note that the mixed-crystal ratio of $(Al_x Ga_{1-x})$ to In, 0.51 to 0.49, means a ratio at which the AlGaInP-based compound semiconductor is matched in lattice to the semiconductor substrate such as of GaAs.

The auto-doping may use a dopant involving, for example, trimethyl aluminum (hereinafter referred to as TMA), triethyl gallium (hereinafter referred to as TEG), and trimethyl gallium (hereinafter referred to as TMG) in an MOCVD process so that the carbon contained in methyl or ethyl radicals are auto-doped to act as a p-type impurity. There is less possibility for carbon to cause internal stresses, leading to cracks, in the crystalline layer as compared to the impurity Mg or Zn, providing a high brightness and reliable semiconductor light emitting device.

The protecting layer may be formed of $Al_z Ga_{1-z} As$ ($0.45 \leq z \leq 0.6$, $z<y$) having an Al mixed-crystal ratio lower than that of the window layer. This is preferred in reliability because the amount of Al is reduced on the surface side of the semiconductor layers to prevent against corrosion by moisture or oxidation.

Specifically, the light emitting layer forming portion may be of a layered structure having a cladding layer of a first conductivity type, an active layer having a composition having a bandgap energy lower than that of the cladding layer, and a cladding layer of a second conductivity type. The second conductivity type cladding layer may be formed by a first layer having a lower carrier concentration and a second layer having a higher carrier concentration, the first layer with a lower carrier concentration being formed on a side close to the active layer. With this structure, the crystallinity is maintained stable by reducing the influence of diffusion of the second conductivity type impurity into the active layer.

According to another form of the present invention, a semiconductor light emitting device, comprises: a substrate; a light emitting layer forming portion formed of AlGaInP-based compound semiconductor on the substrate and having an n-type layer and a p-type layer to provide a light emitting layer; a window layer formed of $Al_y Ga_{1-y} As$ ($0.6 \leq y \leq 0.8$) on a surface side of the light emitting layer forming portion; and a protecting layer formed of $Al_z Ga_{1-z} As$ ($0.45 \leq z \leq 0.6$, $z<y$) on a surface side of the window layer. With this structure, the semiconductor layers are stabilized at the surface thereof, preventing against corrosion, etc.

The protecting layer may be formed in a p-type conductivity by auto-doping with carbon to a carrier concentration of $5\times10^{18}$–$3\times10^{19}$ cm$^{-3}$. This provides lattice-matching to the light emitting layer forming portion to reduce internal stresses within the semiconductor layers, as compared to a case of doping with Zn or Mg. Thus, the light emitting device is enhanced in light emitting efficiency.

The protecting layer may be formed in a thickness of 0.4–1 $\mu$m. This is preferred because light absorption is reduced and the surface of the semiconductor layers is protected.

Also, a method of manufacturing a semiconductor light emitting device, comprises the steps of: (a) epitaxially growing an AlGaInP-based compound semiconductor layer on a semiconductor substrate by an MOCVD process to form a light emitting layer forming portion; and (b) epitaxially growing a p-type window layer of $Al_y Ga_{1-y} As$ ($0.6 \leq y \leq 0.8$) to a carrier concentration of $5\times10^{18}$–$3\times10^{19}$ cm$^{-3}$ on a surface of the light emitting layer forming portion while controlling temperature by an MOCVD process without introducing a dopant gas. With this method, it is possible to readily obtain a window layer controlled in carrier concentration by auto-doping.

For a fuller understanding of the nature and advantages of the invention, reference should be made to the ensuing detailed description taken in conjunction with the accompanying drawings.

DETAILED DESCRIPTION

The present inventors have eagerly studied in order to enhance the light emitting efficiency of a semiconductor light emitting device. As a result, it was found that difficulty in enhance the light emitting efficiency encountered in the conventional semiconductor light emitting device is caused by the doping amount of an impurity such as Zn or Mg being increased to increase the carrier concentration of the p-type window layer which causes internal strains and cracks in the epitaxial grown layer. The present inventors have further studied in order to reduce distortions in crystal lattice due to the doping of the p-type impurity. As a result it was found that where a window layer which is thickest among the semiconductor layers is to be epitaxially grown by an MOCVD method (Metal Organic Chemical Vapor Deposition), if carbon (C) contained in a reacting gas is auto-doped to the window layer without supplying a dopant gas, the resulting semiconductor light emitting device becomes high in carrier concentration and less in crystal distortions providing high brightness and quality.

Figure 1:
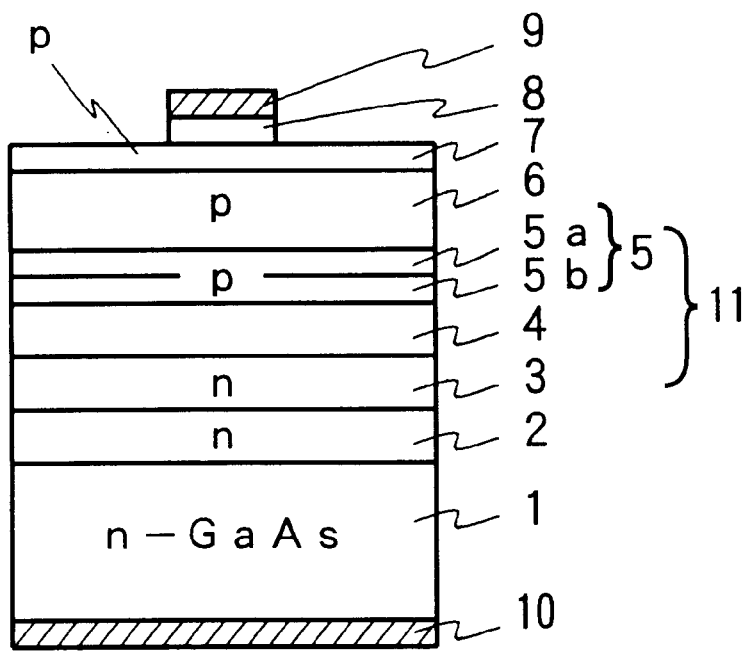
FIG. 1 is a view showing a sectional structure of a semiconductor light emitting device according to one embodiment of the present invention.

That is, the semiconductor light emitting device according to the present invention includes, as shown in a sectional structure of one example in FIG. 1, an n-type GaAs substrate 1 on which a light emitting layer forming portion 11 is formed by an AlGaInP-based compound semiconductor layers to provide therein a light emitting layer. A p-type window layer 6 of $Al_yGa_{1-y}As$ ($0.6 \leq y \leq 0.8$) is formed in a thickness of approximately 5–7 μm on the light emitting layer forming portion 11. A p-side electrode 9 is provided through a protecting layer 7 and a GaAs contact layer 8, while an n-side electrode 10 is provided on a backside of the GaAs substrate 1, thus providing a light emitting chip. The present invention is characterized in that the window layer 6 is auto-doped with carbon or the like in a carrier concentration of $5 \times 10^{18}$–$3 \times 10^{19}$ $cm^{-3}$.

Figure 2:
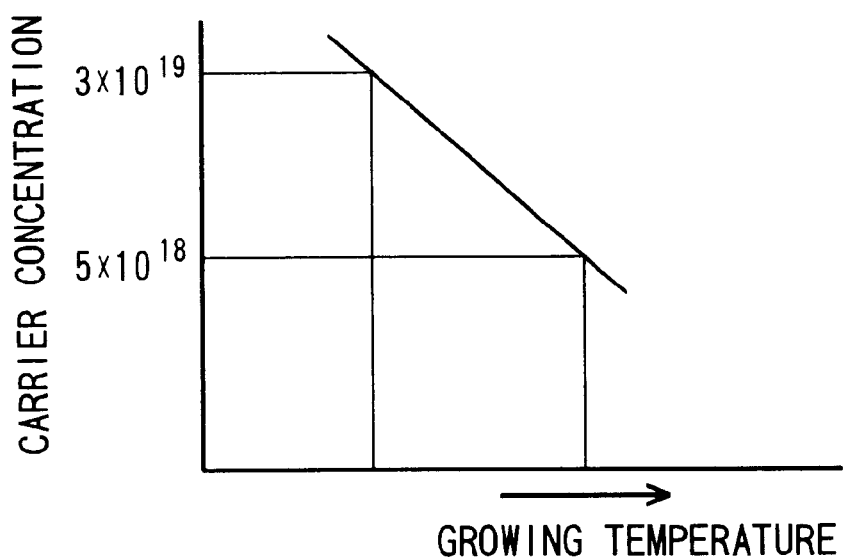
FIG. 2 is a diagram showing a relationship between a growing temperature and a carrier concentration in auto-doping when epitaxially growing an AlGaAs-based compound semiconductor.
Figure 3:
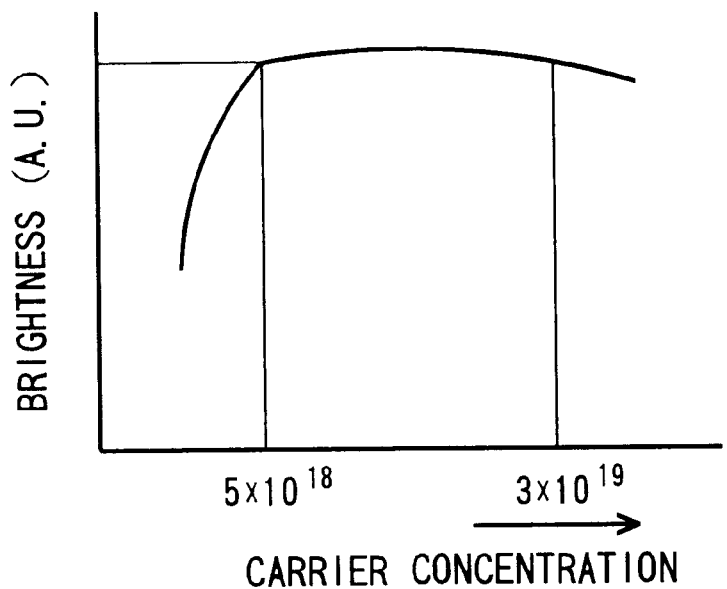
FIG. 3 is a diagram showing a brightness varied with the variation in carrier concentration for a window layer.
Figure 4:
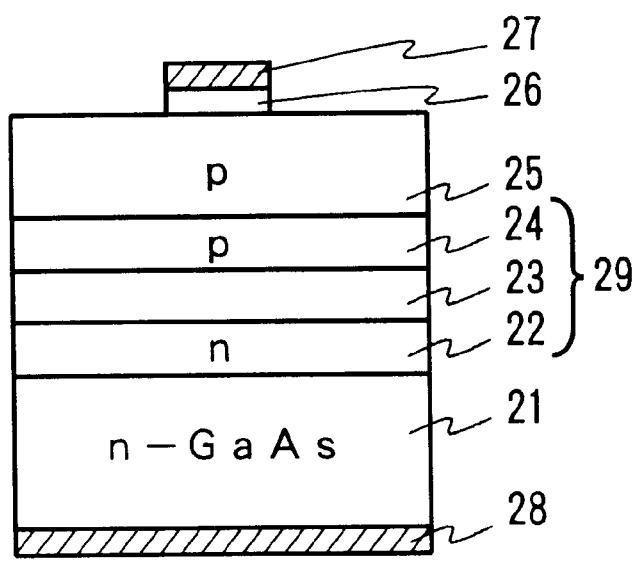
FIG. 4 is a sectional view of a conventional semiconductor light emitting device.

This window layer 6 is formed by doping carbon (C) of ethyl radicals or methyl radicals contained in a reacting gas without supplying a dopant gas during epitaxially growing $Al_yGa_{1-y}As$ while supplying a reacting gas of TMA, TEG or TMG by the MOCVD process. The amount of C auto-doped can be increased by decreasing the epitaxial-growth temperature. That is, the carrier concentration can be increased with decrease in the epitaxial growth temperature, as shown in FIG. 2. When the window layer 6 is auto-doped to a carrier concentration of $5 \times 10^{18}$–$3 \times 10^{19}$ $cm^{-3}$ as shown in FIG. 3, showing the brightness varied by varying the carrier concentration, the resulting semiconductor light emitting device is high in light emitting efficiency.

The light-emitting layer forming portion 11 has various AlGaInP-based compound semiconductor layers epitaxially grown thereon through a buffer layer 2 on a GaAs substrate 1. That is, an n-type cladding layer 3 is formed of an AlGaInP-based compound semiconductor (Al mixed crystal ratio of e.g. 0.65–0.75) doped with Se in a carrier concentration of approximately $8 \times 10^{15}$–$1 \times 10^{18}$ $cm^{-3}$ and having a thickness of approximately 0.3–1 μm. On the n-type cladding layer 3, an active layer 4 is formed of a non-doped AlGaInP-based compound semiconductor having a composition to have a lower bandgap energy than the cladding layer, in a thickness of approximately 0.4–1 μm. On the active layer 4 is formed a p-type cladding layer 5 formed of the AlGaInP-based compound semiconductor, in the same composition as the n-type cladding layer, to have a double-layered structure having a first sublayer 5a and a second sublayer 5b. The first sublayer 5a is doped with Zn in a carrier concentration of approximately $3 \times 10^{16}$–$7 \times 10^{16}$ $cm^{-3}$ and having a thickness of approximately 0.5–1 μm, while the second sublayer 5b is doped with Zn in a carrier concentration of approximately $5 \times 10^{17}$–$2 \times 10^{18}$ $cm^{-3}$ and having a thickness of approximately 0.5–1 μm. The buffer layer 2 is formed of an n-type GaAs doped with Se in a carrier concentration of approximately $7 \times 10^{17}$–$5 \times 10^{18}$ $cm^{-3}$.

The p-type cladding layer 5 is thus constituted by the first sublayer 5a having a lower carrier concentration and the second sublayer 5b having a higher carrier concentration. This structure serves to reduce the diffusion of a p-type impurity into the active layer 4 to thereby maintain good crystallinity, and at the same time prevent a voltage drop from occurring due to a hetero-barrier caused between this layer and the higher carrier-concentration window layer, enhancing light emitting efficiency.

In the embodiment in FIG. 1, a protecting layer 7 is formed of $Al_zGa_{1-z}As$ ($0.45 \leq z \leq 0.6$, z<y) having an Al mixed crystal ratio lower than that of the window layer 6 in a thickness of approximately 0.4–1 μm, on the window layer 6. The protecting layer 7 is doped with Zn to a carrier concentration of approximately $1 \times 10^{19}$–$4 \times 10^{19}$ $cm^{-3}$. This protecting layer is made less reactive to moisture due to reduction of the Al mixed-crystal content lower than the window layer 6, and further less absorptive of the light emitted from the light emitting layer. That is, as the Al mixed crystal ratio z in the composition $Al_zGa_{1-z}As$ decreases, the reactivity to moisture decreases. On the other hand, as the value z becomes greater, the light from the light emitting layer becomes less absorbed by the same layer. In order to fulfill the both requirements, the value z for $Al_zGa_{1-z}As$ is determined in a range of $0.45 \leq z \leq 0.6$, z<y. The protecting layer 7 is preferably formed thin as long as it serves to protect the surface. This is because the absorbing loss of the light increases if this protecting layer is made excessively thick. To meet with this, the protecting layer 7 is formed in a thickness of approximately 0.4–1 μm, as stated above. In this range of layer thickness, the light absorption by the layer 7 is suppressed to a minimum level, and the underlying semiconductor layers are sufficiently protected. This protection layer 7 is also formed by auto-doping without introducing a dopant gas. Due to the auto-doping, the same layer has a carrier concentration to around a level as stated before. This provides a good-quality crystallinity to the semiconductor layer structure, contributing to the enhancement in light emitting efficiency.

On a surface of the protecting layer 7, a contact layer 8 is formed, in a thickness of approximately 0.3–0.5 μm, of GaAs doped with Zn to a carrier concentration of approximately $1 \times 10^{19}$–$1 \times 10^{20}$ $cm^{-3}$. A p-side electrode 9 is formed of an Au—Ti alloy, Au—Ti—Ni alloy or the like on a surface of the contact layer 8. On the other hand, an n-side electrode 10 is formed of an Au—Ge—Ni alloy or the like on a backside of the substrate 1.

To manufacture a semiconductor light emitting device constructed as above, a GaAs substrate 1, for example, of an n-type is first placed within an MOCVD reactor. The reactor is supplied with a reacting gas of TEG or TMG and arsine (hereinafter referred to as $AsH_3$) and an Se dopant gas of $H_2Se$, together with a hydrogen ($H_2$) carrier gas, to form an n-type GaAs buffer layer 2 doped with Se in a carrier concentration of approximately $7 \times 10^{17}$–$5 \times 10^{18}$ $cm^{-3}$ to a thickness of approximately 0.1 μm. Then, TMA and trimethyl indium (hereinafter referred to as TMIn) are further introduced to form an n-type cladding layer 3 of $(Al_{0.7}Ga_{0.3})_{0.51}In_{0.49}P$ in a carrier concentration of approximately $8 \times 10^{15}$–$1 \times 10^{18}$ $cm^{-3}$, to a thickness of approximately 0.3–1 μm. Reducing TMA and increasing TEG of the reacting gas, an active layer 4 is formed of non-doped $(Al_{0.25}Ga_{0.75})_{0.51}In_{0.49}P$ to a thickness of approximately 0.4–1 μm. Supplying a reacting gas similarly to the n-type cladding layer 3 and introducing a Zn dopant gas of dimethyl zinc (hereinafter referred to as DMZn) in place of $H_2Se$, a first layer 5a is formed of $(Al_{0.7}Ga_{0.3})_{0.51}In_{0.49}P$ in a carrier concentration of approximately $3 \times 10^{16}$–$7 \times 10^{16}$ $cm^{-3}$ to a thickness of 0.5–1 μm. Further, a second layer 5b is subsequently formed of the same composition but in a carrier concentration of approximately $5 \times 10^{17}$–$2 \times 10^{18}$ $cm^{-3}$ to a thickness of 0.5–1 μm. A light emitting layer forming portion 11 is thus epitaxially grown on the buffer layer 2.

Further, the reacting gas is changed to TEG, TMG and $AsH_3$ with the dopant gas stopped of supply, a window layer 6 is formed of $Al_yGa_{1-y}As$ ($0.6 \leq y \leq 0.8$, e.g. y=0.7) by auto-doping with the carbon (C) content of ethyl or methyl radicals to have a carrier concentration of $5 \times 10^{18}$–$3 \times 10^{19}$ $cm^{-3}$ and a thickness of approximately 5–7 μm. On the window layer 6, a protecting layer 7 is further formed, by reducing TMA, of $Al_zGa_{1-z}As$ ($0.45 \leq y \leq 0.6$, z<y, e.g. y=0.5) in a carrier concentration of approximately $1 \times 10^{19}$–$4 \times 10^{19}$ $cm^{-3}$ to a thickness of approximately 0.4–1 μm. Then, the supply of TMA is stopped to introduce DMZn to thereby form a contact layer 8 of GaAs in a carrier concentrate of approximately $1\times10^{19}$–$1\times10^{20}$ cm$^{-3}$ to a thickness of approximately 0.3–0.5 μm.

On the substrate thus eitaxially grown, a p-side electrode 9 is formed of an Au—Ti alloy or Au—Zn—Ni alloy at a top surface thereof and an n-side electrode 10 is formed of an Au—Ge—Ni alloy at a backside thereof, followed by being divided by dicing into individual chips.

According to the present invention, a window layer of an AlGaAs-based compound semiconductor is provided over a light emitting layer forming portion formed of an AlGaInP-based compound semiconductor. The window layer, thickest of the semiconductor layers overlying a substrate, utilizes carbon introduced by auto-doping as a dopant therefor instead of using a 2-valence element such as Mg and Zn. This makes it possible to reduce the carrier concentration of the window layer and distortions of lattice between the window layer and the light-emitting portion forming portion 11. That is, the AlGaAs-based compound semiconductor doped with a 2-valence element tends to induce lattice strains that are increased with increase in amount of the dopant, and this might cause cracks in the semiconductor layer or in the chip, resulting in lower in the light emitting efficiency. In the present invention, however, the AlGaAs-based compound semiconductor has a dopant C introduced by auto-doping, and is free of internal stresses even if the carrier concentration is increased.

Further, the provision of the protecting layer reduces the area of the electrode that is formed on the surface of the semiconductor layer through the contact layer to a minimum. The remaining surface of the semiconductor layers is covered by the protecting layer that is low in Al mixed crystal ratio. Meanwhile, the AlGaAs-based compound semiconductor, if having an Al mixed crystal ratio of higher than 0.6, is prominent in corrosion or oxidation. However, if the Al mixed crystal ratio is lower than 0.6, the resulting semiconductor layer is stable due to the suppression in corrosion or oxidation. Due to this, even where the light emitting device in use is intruded by moisture through an interface between the top surface of the semiconductor layer and the resin covering thereover, or contacted with moisture or oxygen due to direct exposure, the corrosion or oxidation is less advanced at the top surface of the semiconductor layer, thus maintaining the device stable. Accordingly, the light emitting layer forming portion is free from corrosion or oxidation, and unchanged in light emitting characteristics. Meanwhile, the protecting layer less absorbs light because its bandgap energy is lower than the window layer but higher than the light emitting layer forming portion. Further, because electric current diffusion is effected by the window layer, the protecting layer can be reduced in thickness to an extent satisfactorily covering the surface. Thus, the protecting layer absorbs less light, and hence does not cause lower in light emitting efficiency. The semiconductor light emitting device obtained is highly reliable against corrosion on the semiconductor layer while maintaining the light emitting efficiency high. Incidentally, the protecting layer is effective against intrusion of moisture, even where a p-type dopant is introduced to the window layer by a process other than auto-doping.

This protecting layer 7, if using carbon together with the window layer without doped with a 2-valence element such as Mg and Zn, is lattice-matched to the light emitting layer forming portion. The resulting semiconductor light emitting device is free of internal strains, providing a high light emitting efficiency.

Incidentally, the above embodiments were of a double-hetero junction structure having the active layer 4 sandwiched between the respective cladding layers 3, 5, wherein the active layer 4 is different in material, e.g. Al mixed crystal ratio, from the cladding layers to enhance carrier confinement within the active layer 4 as a light emitting layer. This invention is also applicable to a p-n junction structure having a p-n junction as a light emitting layer in place of using an active layer.

Although in the above embodiments the semiconductor layers for the semiconductor light emitting device were formed by a concrete semiconductor materials having a particular thickness and carrier concentration, the present invention is not limited to these examples.

According to the semiconductor light emitting device having an auto-doped window layer, there encounters no internal strains or distortions due to mismatch in lattice constant between the light emitting layer forming portion and the window layer. Thus, the semiconductor light emitting device is high in light emitting efficiency and brightness. It is therefore possible for the semiconductor light emitting device of the invention to use as a light emitting element requiring high brightness, such as for outdoor displays and vehicular tail or stop lamps, or reduction in power consumption, such as for handy telephones or battery-driven portable units.

Meanwhile, where the window layer is formed of an AlGaAs-compound semiconductor for a semiconductor light emitting device, if a protecting layer is formed of an AlGaAs-based compound semiconductor with an Al mixed-crystal ratio lower than that of the window layer, the semiconductor layer are prevented from being corroded or oxidized and hence deteriorated due to intrusion of moisture or the like. Thus the semiconductor light emitting device is high in wet resistance and hence reliable.

Although preferred embodiments have been described in some detail, it is to be understood that certain changes can be made by those skilled in the art without departing from the spirit and scope of the invention as defined by the appended claims.

What is claimed is:

1. A method of manufacturing a semiconductor light emitting device, comprising the steps of:

(a) epitaxially growing an AlGaInP-based compound semiconductor layer on a semiconductor substrate by an MOCVD process to form a light emitting layer forming portion; and (b) epitaxially growing a p-type window layer of $Al_yGa_{1-y}As$ ($0.6 \leq y \leq 0.8$) to a carrier concentration of $5\times10^{18}$–$3\times10^{19}$ cm$^{-3}$ on a surface of said light emitting layer forming portion while controlling temperature by an MOCVD process without introducing a dopant gas.

2. A method according to claim 1, further including a step of growing a protecting layer of $Al_zGa_{1-z}As$ ($0.45 \leq z \leq 0.6$, z<y) by decreasing a flow rate of trimethyl aluminum as a reacting gas containing Al after growing said window layer.

* * * * *